(12) United States Patent
Loibl et al.

(10) Patent No.: US 11,157,663 B2
(45) Date of Patent: Oct. 26, 2021

(54) METHOD FOR PRODUCING A HIGH DEFINITION ANALOGUE AUDIO STORAGE MEDIUM

(71) Applicant: Rebeat Innovation GmbH, Tulln (AT)

(72) Inventors: Günter Loibl, Tulln (AT); Volker Schmidt, Pischelsdorf am Kulm (AT)

(73) Assignee: Rebeat Innovation GmbH, Tulln (AT)

( * ) Notice: Subject to any disclaimer, the term of this patent is extended or adjusted under 35 U.S.C. 154(b) by 361 days.

(21) Appl. No.: 16/081,280

(22) PCT Filed: Mar. 10, 2017

(86) PCT No.: PCT/EP2017/055664
§ 371 (c)(1),
(2) Date: Aug. 30, 2018

(87) PCT Pub. No.: WO2017/153572
PCT Pub. Date: Sep. 14, 2017

(65) Prior Publication Data
US 2019/0065662 A1    Feb. 28, 2019

(30) Foreign Application Priority Data
Mar. 10, 2016   (EP) ..................... 16159741

(51) Int. Cl.
*G06F 30/17*       (2020.01)
*G11B 3/72*        (2006.01)
(Continued)

(52) U.S. Cl.
CPC .............. *G06F 30/17* (2020.01); *G11B 3/685* (2013.01); *G11B 3/70* (2013.01); *G11B 3/72* (2013.01); *G11B 7/261* (2013.01)

(58) Field of Classification Search
CPC ......... G06F 30/17; G06F 30/00; G11B 3/685; G11B 3/70; G11B 3/72; G11B 7/261
(Continued)

(56) References Cited

U.S. PATENT DOCUMENTS

| 4,152,726 A | 5/1979 | Kojima et al. |
| 4,484,320 A | 11/1984 | Redlich |

(Continued)

FOREIGN PATENT DOCUMENTS

| DE | 19947579 A1 * | 4/2001 | ............. G11B 7/245 |
| WO | 2007034390 A2 | 3/2007 | |

OTHER PUBLICATIONS

Sadeghifar, M. Reza et al., "A Higher Nyquist-Range DAC Employing Sinusoidal Interpolation", 2010, IEEE. (Year: 2010).*

(Continued)

*Primary Examiner* — Cedric Johnson
(74) *Attorney, Agent, or Firm* — Budzyn IP Law, LLC

(57) ABSTRACT

The present invention provides a computer-implemented method and an apparatus for manufacturing an analogue audio storage medium wherein digital audio data is converted into topographical data representing an analogue translation of the digital audio data, and a laser beam is selectively applied to a substrate to form a physical imprint of the topographical data on the surface of the substrate to create an analogue audio storage medium. The medium may be directly playable on a conventional playback device such as a record player and/or used to mould further playable mediums. The invention thereby enables more efficient manufacturing of e.g. vinyl records and consistently ensures a much higher quality of analogue audio.

18 Claims, 13 Drawing Sheets

(51) Int. Cl.
*G11B 3/70* (2006.01)
*G11B 3/68* (2006.01)
*G11B 7/26* (2006.01)

(58) Field of Classification Search
USPC .......................................................... 703/7, 6
See application file for complete search history.

(56) References Cited

U.S. PATENT DOCUMENTS

| | | | | |
|---|---|---|---|---|
| 4,861,437 | A * | 8/1989 | Koop | G11B 3/685 |
| | | | | 205/50 |
| 6,011,767 | A * | 1/2000 | Abraham | G03H 1/0236 |
| | | | | 369/103 |
| 2003/0207206 | A1* | 11/2003 | Olson | G11B 7/244 |
| | | | | 430/270.14 |
| 2004/0052190 | A1* | 3/2004 | Sako | G11B 20/10 |
| | | | | 369/59.24 |
| 2005/0018738 | A1 | 1/2005 | Duan et al. | |
| 2006/0182154 | A1 | 8/2006 | Tanaka et al. | |
| 2006/0182418 | A1* | 8/2006 | Yamagata | G11B 27/329 |
| | | | | 386/248 |
| 2008/0059648 | A1* | 3/2008 | Manges | H04N 21/234318 |
| | | | | 709/231 |
| 2008/0074486 | A1* | 3/2008 | Robinson | G11B 33/10 |
| | | | | 347/264 |
| 2009/0109274 | A1* | 4/2009 | Hori | B41J 3/4071 |
| | | | | 347/247 |

OTHER PUBLICATIONS

Park, Yujin et al., "Low Noise Output Stage for Oversampling Audio DAC", 2015, IEEE. (Year: 2015).*

International Search Report and Written Opinion for corresponding PCT Application No. PCT/EP2017/055664 dated Jun. 7, 2017.

Office Action for European Application No. 17709117.0 dated Jan. 2, 2021.

Amanda Ghassaei: "3D Printed Record: 8 Steps (with pictures)", Jan. 1, 2013.

Amanda Ghassaei: "Laser Cut Record: 7 Steps (with pictures)", Jan. 1, 2015.

* cited by examiner

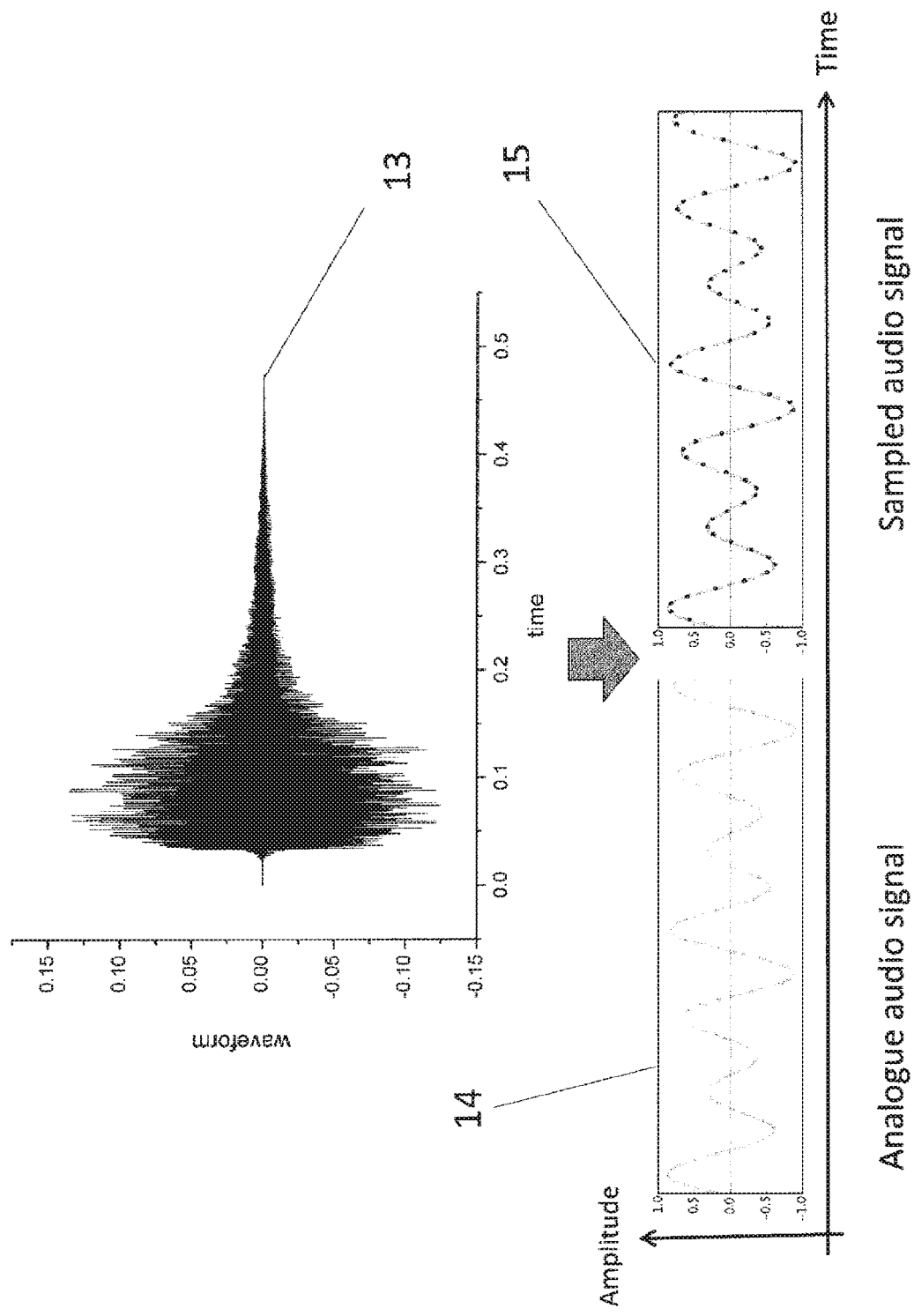

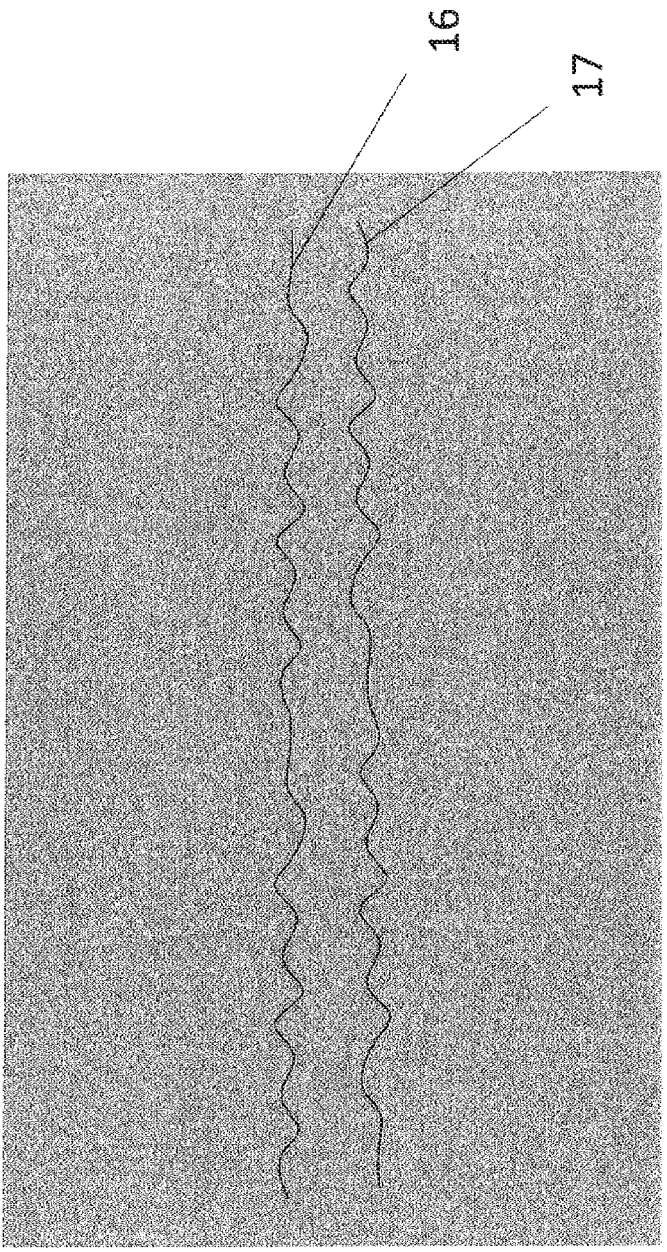

Extruded and trimmed surface (groove): linear representation of audio data for left and right channel

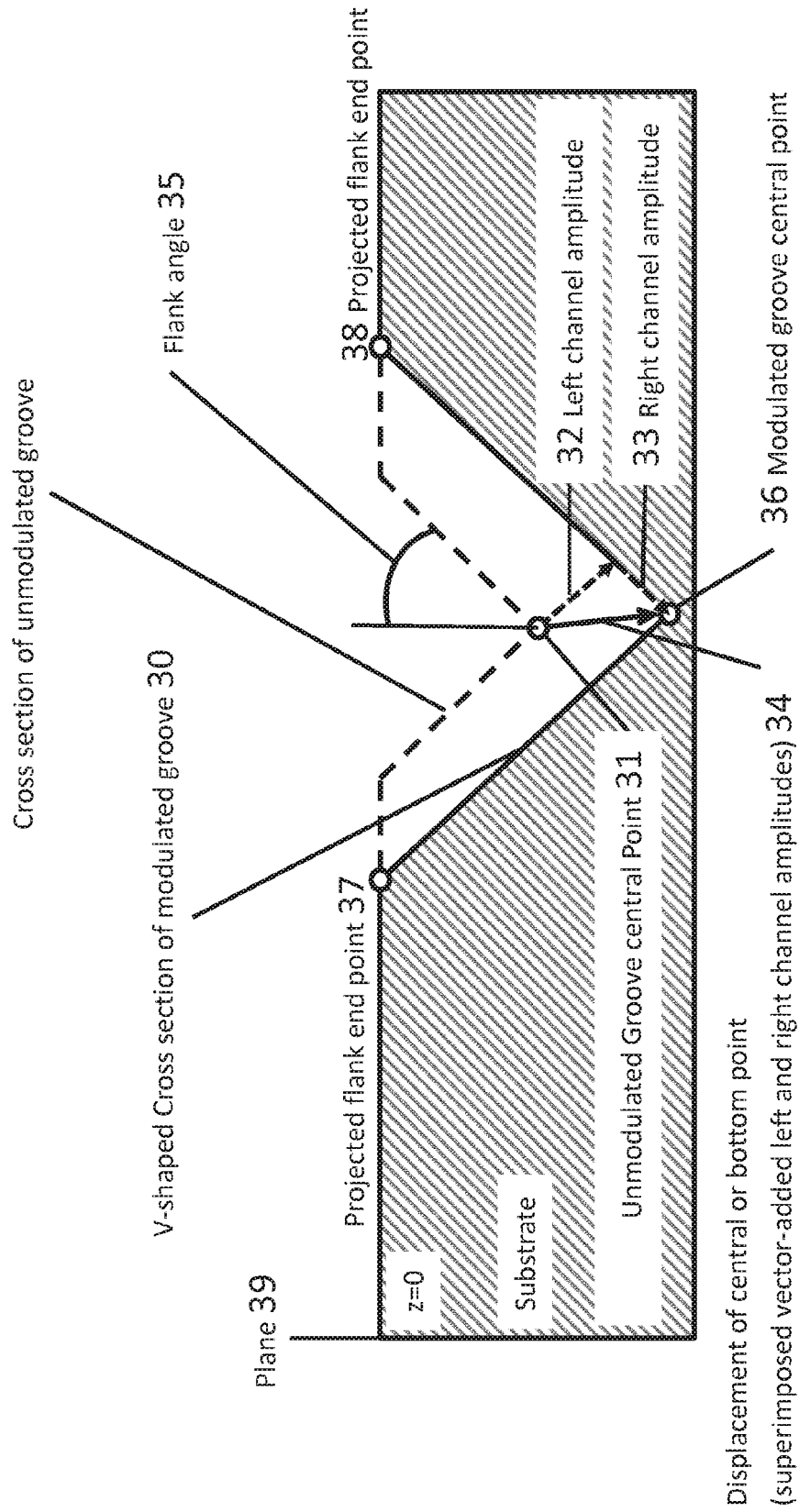

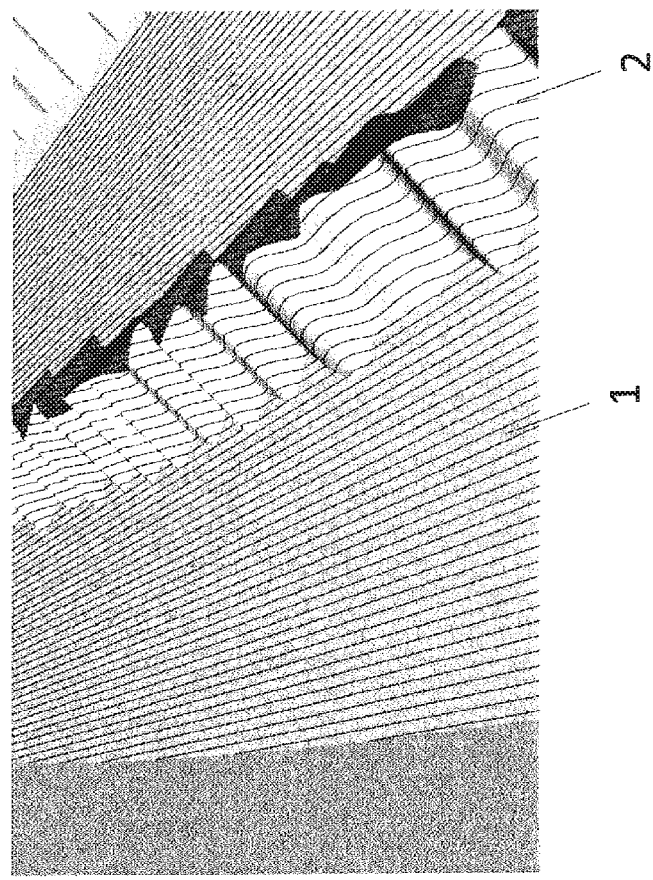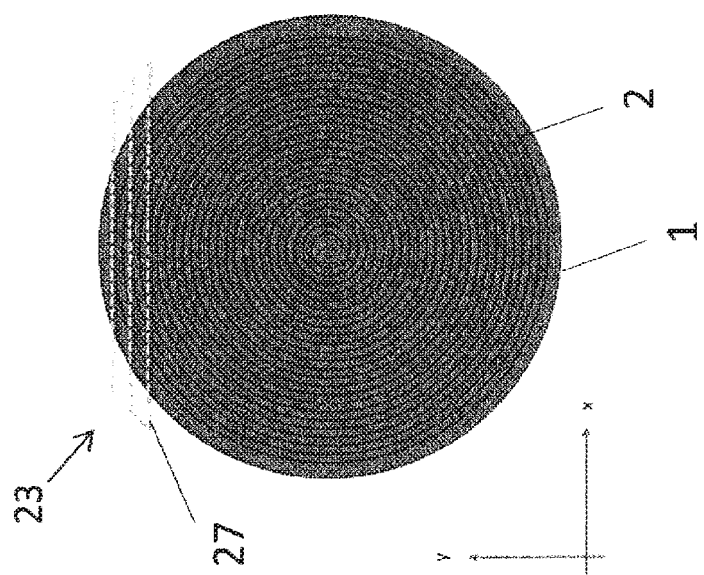
FIG. 5a
FIG. 5b

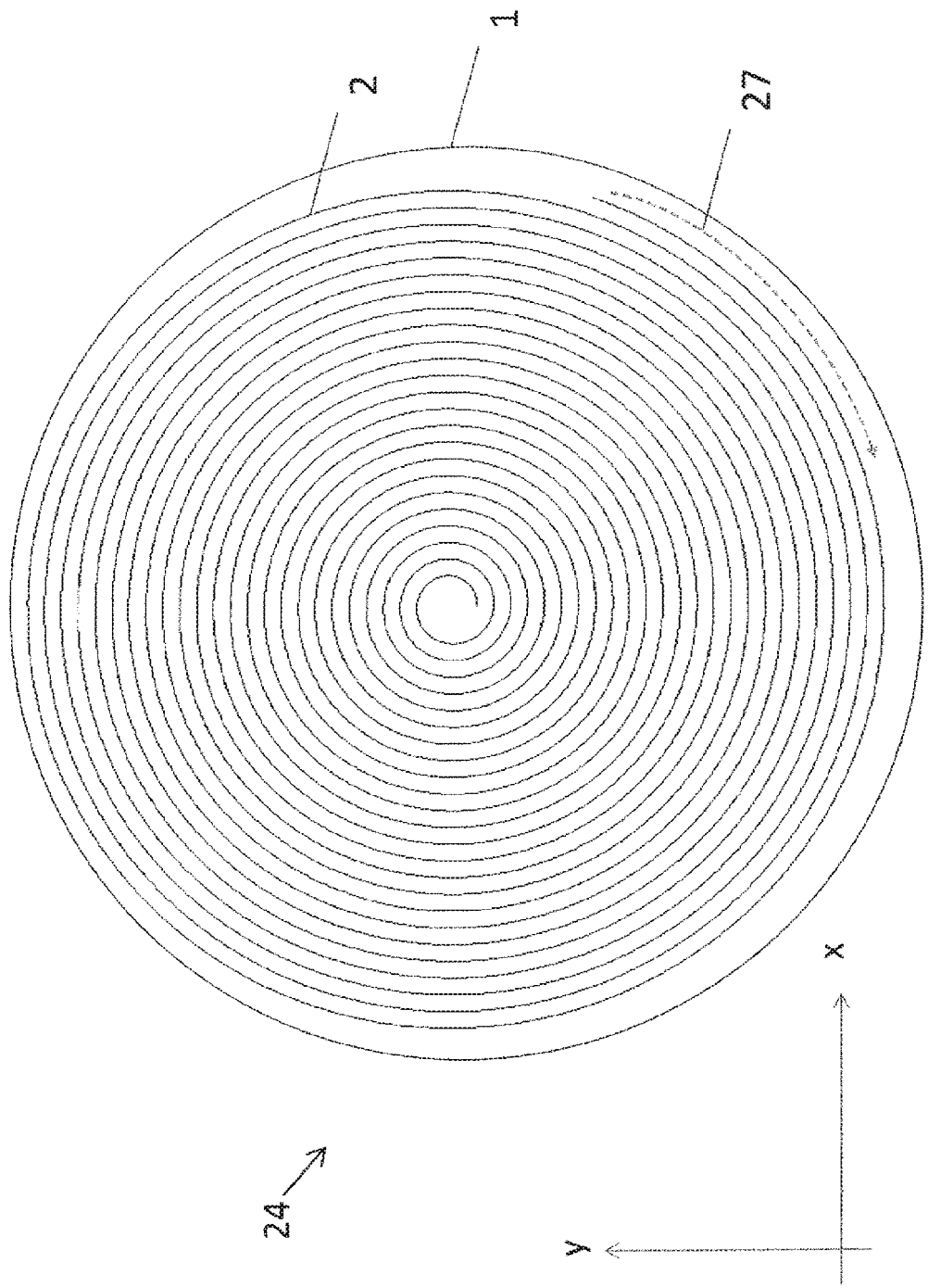

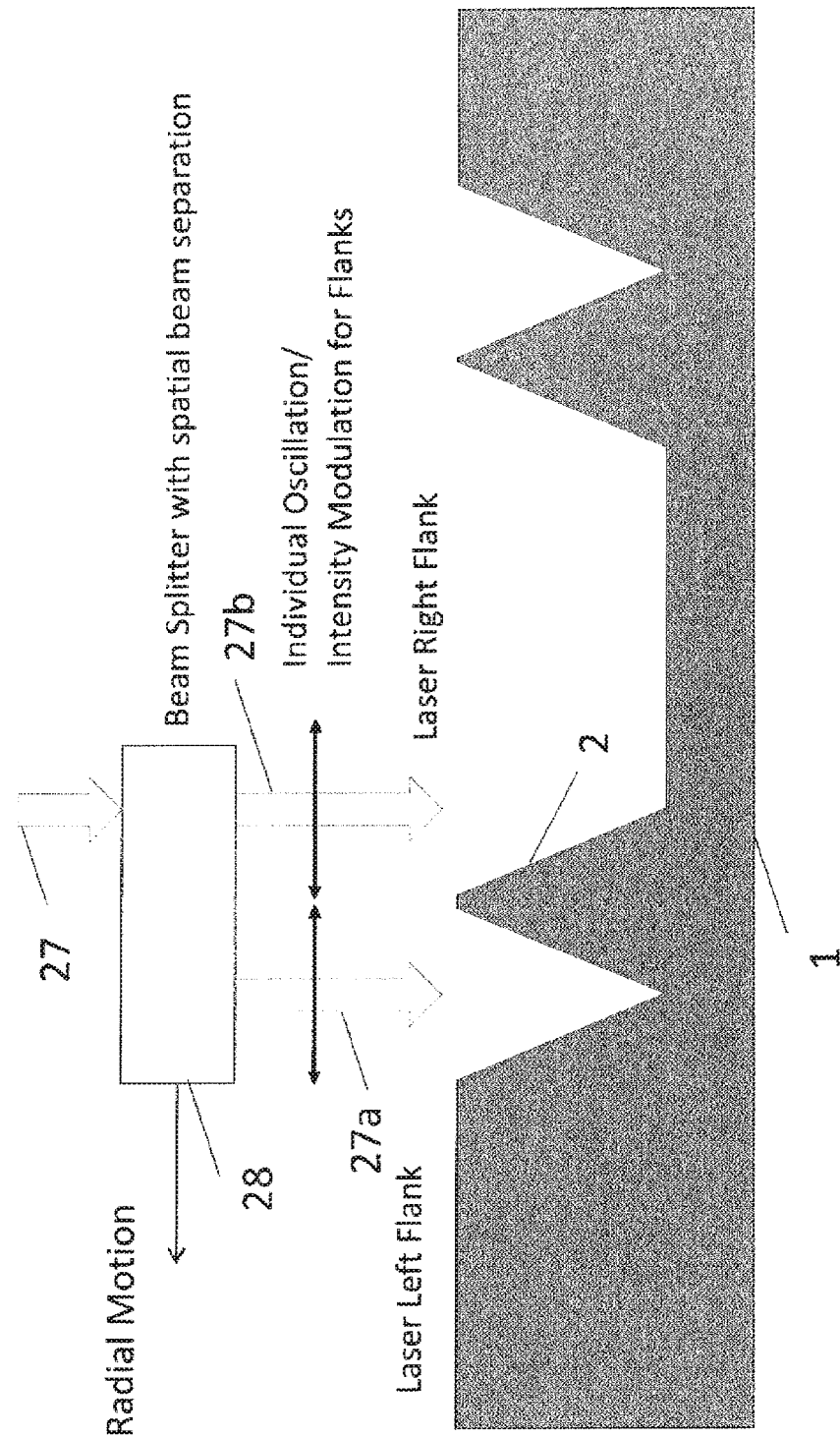

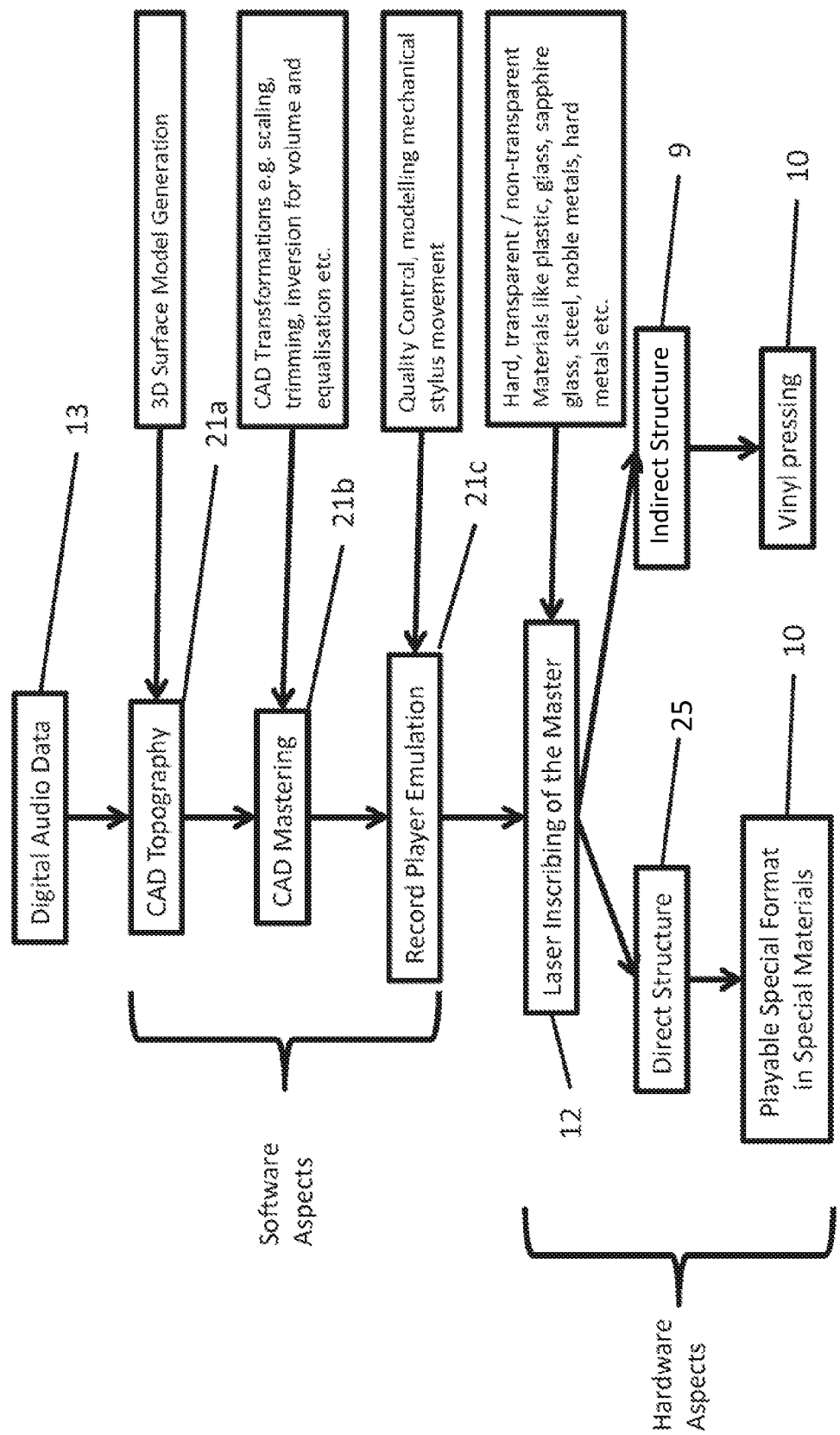

METHOD FOR PRODUCING A HIGH DEFINITION ANALOGUE AUDIO STORAGE MEDIUM

TECHNICAL FIELD

The present invention relates to the manufacture of an analogue audio storage medium. Specifically, the present invention relates to the computer-controlled audio data transformation into a CAD compatible representation of the audio data and the laser inscribing (or laser engraving) of a medium and an apparatus for the manufacture of such an analogue audio storage medium which may be played on conventional playback devices such as record players.

BACKGROUND

The current method of manufacturing vinyl records is through pressing a previously produced master (stamper or master matrix) into a special polyvinylchloride compound. This method of manufacture has barely changed over the past 60 years. There are two established processes for producing such masters, the traditional coating process and Direct Metal Mastering (DMM).

According to the traditional coating process, a mastered recording is inscribed in a hard lacquer plate using a cutting device such as a Neumann lathe with a cutting head (writing stylus). The lacquer plate is then silvered to make it electrically conductive and then copper or nickel plated. The copper or nickel plate is separated from the silvered lacquer plate (which is usually disposed of) and forms a negative copy of the master known as a negative master plate or "father". Subsequently a number of positive "mother" plates are manufactured through electroplating the father. These mother plates are checked for errors and represent playable duplicates of the lacquer plate. From these positives, negative extrusion dies known as "stampers" are formed which are then plated with chrome before used for vinyl pressing. The chrome plating provides a hard stain-free surface which prolongs the durability.

A further process for pressing vinyl that was developed at the beginning of the 1980s is DMM. According to DMM, a record cutter engraves the audio signal directly onto a copper-plated master disc. The DMM copper master disc can be plated directly to produce the required number of stampers using a single-step plating process, thereby eliminating the need to form a negative master "father". The DMM copper disc serves as the "mother" itself. By bypassing the traditional silvering process and two electroforming steps as described above, the risk of introducing noise that can be generated in the electroforming (galvanic) process is reduced. However the durability of the pressed vinyl records may not be as high due to a reduced depth of the record groove.

The most considerable disadvantages of both the traditional and DMM techniques are the laborious and environmentally damaging processes in addition to the need to dampen high frequencies in order to avoid the record cutter from overheating or being damaged through overheating through quick movement. A further disadvantage is caused by the lacquered plate and metal master being cut tangentially in contrast to the arm of the record player moving radially, thereby giving way to different cuts and playing angles which lead to a decrease in audio playback quality due to geometric flaws in the manufacture and limitations for reproducing frequency response.

There have been individual attempts to directly inscribe audio signals in different materials using modern technology, for example $CO_2$-laser engraving or the use of a 3D printer, however these have proven to have many major drawbacks. The sound quality is extremely low in comparison to records produced by traditional techniques and the grooves are significantly wider and deeper which severely limits the amount of audio data that may be stored on the record.

All other alternative techniques of manufacturing records other than the traditional techniques fail to produce an acceptable quality of audio playback.

SUMMARY OF INVENTION

The present invention overcomes these problems by providing a method according to the independent claims. Further advantageous embodiments of the invention are defined by the dependent claims.

The present invention provides a computer-implemented method of manufacturing an analogue audio storage medium. In a first step, digital audio data is converted into topographical data representing an analogue translation of the digital audio data. In other words, a 3D surface model i.e. topography is generated from the digital audio data using software. The digital audio data to be converted may initially comprise compressed audio data files such as .MP3, .WMV or .AAC audio data files, or uncompressed data files such as pulse code modulation (PCM) .WAV or AIFF files. The digital audio data may also comprise digitised analogue audio data. Further, the conversion of the digital audio data may be performed by processing a data file such as those mentioned before, but may also be performed on an audio data stream, which enables piecewise processing of the digital audio data. In the case of the latter, the resulting topographical data does not need to be complete in order to proceed with the laser inscribing process, thereby reducing latency. In a second step, a laser beam is selectively applied to a substrate to form a physical imprint of the topographical data on the surface of the substrate to create an analogue audio storage medium. According to the invention, the laser beam selectively ablates the surface of a substrate corresponding to the generated 3D surface model of the converted digital audio data, thereby creating an analogue storage data on the surface of the substrate which may directly or indirectly played back by an analogue playback device.

By virtue of the aforementioned method steps, the present invention provides a laser manufacturing process for producing High Definition (HD) Audio master matrices which enables, for example, LP records to be produced with full frequency response and a striking improvement in listening quality. The method of the present invention is easily scalable in both speed and throughput and is not subject to the geometric disadvantages of known mechanical engraving techniques such as the friction of the cutter which impairs the writing speed and quality of analogue audio data and the lack of suitable materials that may be used as a substrate.

In a preferred embodiment of the invention, the digital audio data is imported into CAD software which is then used to translate the digital audio data into analogue data. This enables generation of a complex surface topography representing the transformed audio data and ensures that the quality of audio is maintained during the transformation. The digital audio data may imported into the CAD program in its entirety before further processing commences, however the digital audio data may also be imported into the CAD program as a data stream wherein the CAD processing to convert the data may already commence before all the data has been imported in the program.

In a preferred embodiment of the invention, the topographical data is processed with an emulator of an analogue playback device for pre-production verification. When creating the 3D model, the audio waveform data may be combined with general parameters of known playback mediums and playback devices, for example, the diameter of a (gramophone) record, its playback speed and its groove width. This ensures that the topographical data is converted into a form which ensures high playback quality on a conventional playback device such as a record player. Furthermore, by processing the data in this manner, the topographical data can be tailored to a specific playback format or device for the best playback quality on that individual device. In a preferred embodiment, RIAA equalisation is applied to the audio data which is processed to match the best available audio-quality whilst still remaining in conformation with the standard RIAA curve and additionally expanding this frequency curve with frequencies above the regular 20 kHz. By processing the audio data in this manner, the requirements for high-definition audio are matched.

In a further preferred embodiment, the software also performs mastering of the topographical data in order to modulate the sound quality and frequency response. This is achieved by using CAD transformations e.g. scaling, cutting, inverting for volume and equalisation. In the case of the storage medium being a record, the 3D model comprises a groove or rill which the software optimises by adjusting its width. Preferably, the mastering process further includes applying a so-called Rheinsche Füllschrift process to ensure that, in quieter parts of the audio, the groove spacing is reduced whereas in louder parts of the audio, the groove spacing is increased. By modulating the data in this way, the present invention enables a minimum increase of volume of about 20 percent and/or an increase of the length of play of the record. Furthermore, the discrepancy between the tangential cutting angle and radial playback angle as described in the background is overcome with the aforementioned mastering. A much higher level of improvement of the audio quality is thereby achieved.

In a further preferred embodiment, the forming of the physical imprint is performed by raster scanning. The laser beam and/or the substrate are moved such that the beam is selectively applied to the surface area of the substrate in a sequence of scan lines (preferably horizontal or vertical strips) and the physical imprint is formed one line at a time. This technique eliminates geometric cutting flaws caused, for example, by the rotational movement used in traditional processes. In a preferred embodiment thereof, the substrate remains stationary whilst laser beam emitter is mounted on a scanner which is controlled by the computer software. In this manner, the laser performs ablation on the substrate rather like the process of most printers.

In a different preferred embodiment to the above, the forming of the physical imprint is performed by vector scanning. For example, as stated above, the laser beam emitter may be mounted on a scanner including one or more mirror galvanometers to position and steer the laser beam and which enable the beam to be is selectively applied to the substrate in a circular rotational motion. In the case of forming a record, the beam may be applied to the substrate in a circular motion in order to imprint the topographical data in the form of a spiral groove.

In a preferred embodiment, the laser beam is emitted from at least one short pulse laser, preferably a femtosecond (fs) or picosecond (ps) laser which emits sub-nanosecond laser pulses. By using short pulse lasers, this embodiment ensures that the ablation of the substrate surface is very accurate whilst reducing the risk of melting the substrate which would lead to a deterioration of sound quality of the physical imprint. In further embodiments, one or more laser sources or repetitive scanning over same positions may be applied in order to remove a sufficient amount of material.

In a further preferred embodiment of the aforementioned embodiments, the physical imprint directly corresponds to the topographical data and the analogue audio storage medium can be directly played by an analogue playback device. According to this embodiment, an instantly playable master is formed on the substrate, thereby obviating the labour and resource-intensive manufacturing steps normally involved in creating a master and enabling a wider range of materials to be used as the substrate. For example, it is possible to produce a master in a special format product made from special materials which are explained in more detail below.

In an alternative embodiment to this, the physical imprint comprises an inverse topography of the topographical data and the analogue audio storage medium formed is a negative master. As with the embodiment described directly above, this enables a negative master or "stamper" to be directly manufactured without the need for the time-consuming and labour and resource-intensive manufacturing steps normally required in order to create a negative master from a studio recording master. As described before, since a wider range of materials is available for the substrate, it is possible to produce an extremely durable and hard-wearing stamper with a much longer lifespan than conventional negative masters, thereby enabling an extraordinary increase in the number of press-moulded vinyl records that may be produced therewith. For example, as a result of especially hard and durable materials being inscribed, a single negative master formed by the aforementioned process is able to be used for over 1000 pressings and in many cases may even be used for over 8000 pressings without a deterioration in audio quality.

In a preferred embodiment, the substrate comprises such hard materials as e.g. steel, glass or sapphire glass. As previously described, unlike mechanical engraving techniques, the laser ablation of the present invention enables the imprinting of the substrate to be performed on extremely hard and resilient materials which last longer and are less prone to damage from multiple use without further treatment i.e. coating.

In a further preferred embodiment, a coating layer is applied to the analogue audio storage medium. In order to provide further protection and increase durability and enable multiple use, a coating layer of a suitable material such as chrome may be added to the surface of the ablated medium to protect the physical imprint from damage.

In another aspect, the invention comprises an apparatus for manufacturing an analogue audio storage medium, wherein the apparatus comprises means operative to convert digital audio data into topographical data representing an analogue translation of the digital audio data. Such conversion means preferably comprises CAD software. The invention further comprises means to selectively apply a laser beam to a substrate to form a physical imprint of the topographical data on the surface of the substrate to create an analogue audio storage medium. Such inscribing means preferably comprises a laser emitter combined with a scanning device suitable for accurately controlling the position of the laser beam to inscribe the analogue data on the substrate. The skilled person will appreciate that the aforementioned means may be combined or distinct to one another and may each comprise a single or multiple integral or discrete means or devices.

In yet another aspect, a computer-implemented storage medium is provided with instructions wherein, when the instructions are executed by a processor, cause the method step of converting digital audio data into topographical data representing an analogue translation of the digital audio data to be performed. According to the invention, the generated topographical data is suitable for i.e. in a readable format for inputting into a device suitable for performing a laser inscription process to inscribe the topographical analogue audio data on the substrate. In a preferred implementation, the computer-implemented storage medium is a portable memory device such as a USB memory stick which interfaces with the device. Upon reading the data, the device is then able to selectively apply a laser beam to a substrate to form a physical imprint of the topographical data on the surface of the substrate to create an analogue audio storage medium. The skilled person will understand that such a computer-implemented storage medium is not limited to the aforementioned example and may also be implemented as a CD/DVD-ROM, SD card or the like.

BRIEF DESCRIPTION OF THE DRAWINGS

FIGS. 3a-3e show the conversion of digital audio data into analogue audio data and CAD-generated 3D topographical representations of the converted data;

FIGS. 5a and 5b show an example of laser raster scanning with a single laser beam and an example of the 3D inverse topology formed.

FIG. 6 shows a diagram of laser vector scanning according to a preferred embodiment of the present invention;

FIG. 7 shows an example of laser vector scanning with a rotating target or laser head and two parallel beams to form an inverse topology according to a preferred embodiment of the present invention;

FIG. 9 shows a flow diagram of preferred embodiments of the present invention including both the software and hardware-based aspects thereof.

DETAILED DESCRIPTION

Figure 1:
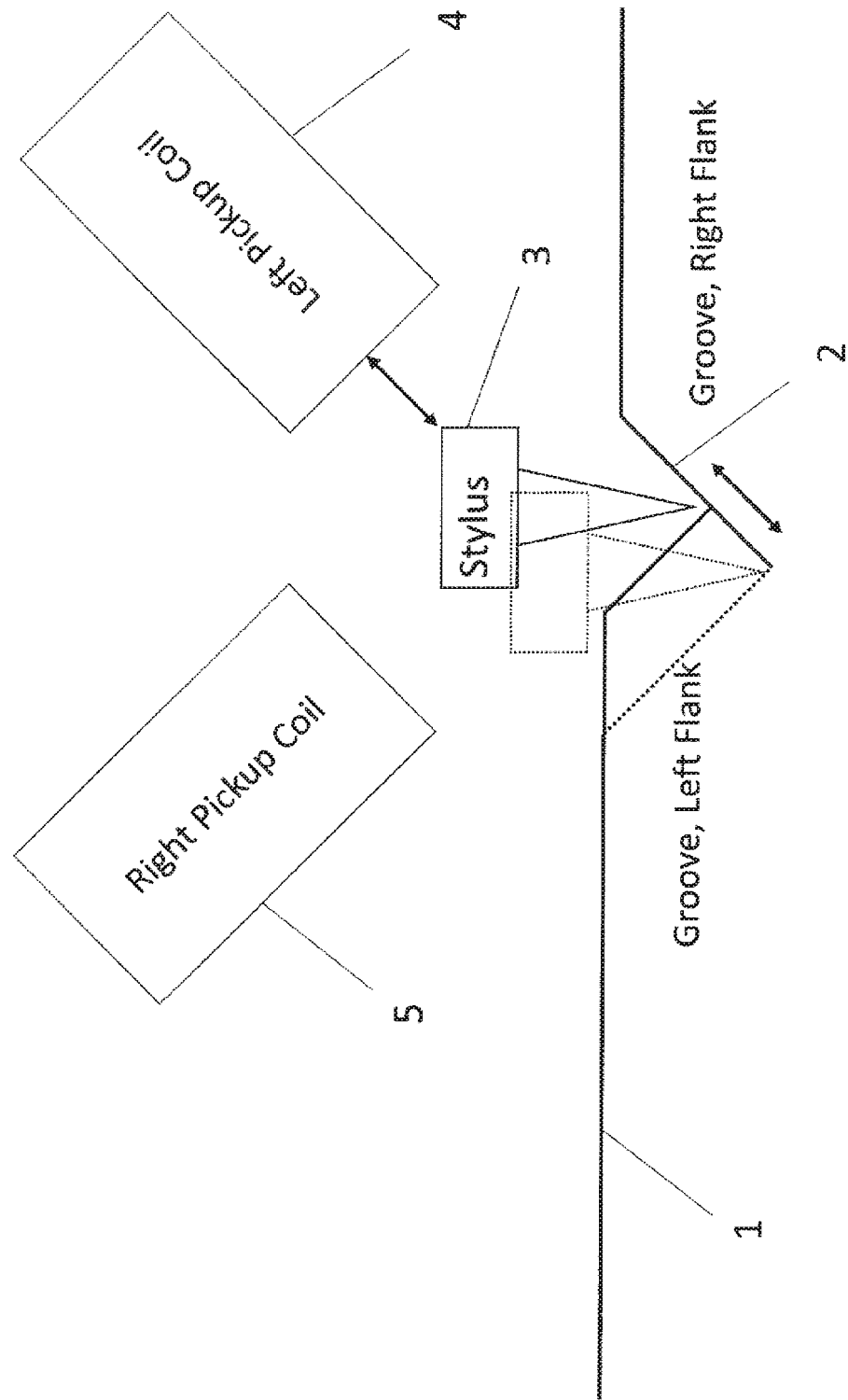
FIG. 1 shows an example of a prior art playback mechanism for stereo analogue audio from a gramophone record.

FIG. 1 discloses an example of a prior art playback mechanism for stereo analogue audio data from a substrate formed into an analogue audio medium 1 (gramophone record). The two stereo channels are represented by a physical imprint 2 of the audio data in the shape of a groove. The groove comprises separate walls (left and right flanks) which independently carry the two stereo channels. Conventionally, the inner wall carries the left-hand channel and the outer wall carries the right-hand channel. Each wall face moves at 45 degrees to the plane of the record surface in correspondence with the signal level of that channel. During playback, the movement of a single stylus 3 tracking the groove is sensed independently, e.g. by two pickup coils 4 and 5, each mounted diagonally opposite the relevant groove wall.

Figure 2:
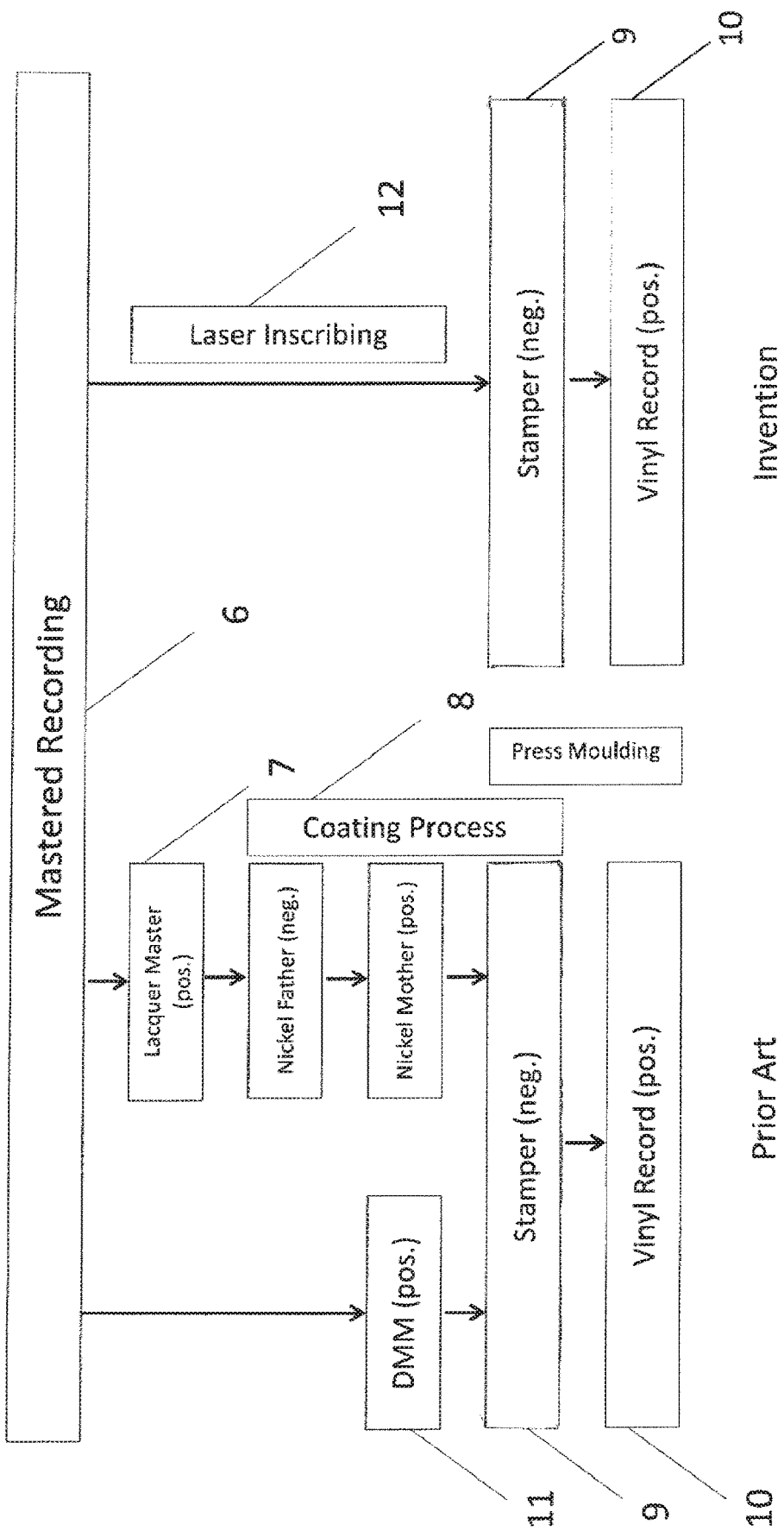
FIG. 2 shows a flowchart of the method steps involved in the conventional production of vinyl records versus the method of the invention.

FIG. 2 shows a flowchart of the method steps involved in the conventional production of vinyl records versus the method of the invention. According to conventional techniques as described in the background, a mastered recording 6 is used to cut a positive lacquer plate 7 which is subsequently subject to a coating and electroplating process 8 to create an indirect structure i.e. negative stamper 9 which can be used to press playable vinyl records 10. In an alternative conventional process, the mastered recording is directly cut into a metal plate 11 using DMM and the stamper 9 is then generated from the inscribed metal plate 11. In distinct contrast thereto, the present invention uses digital audio data as the mastered recording 6 to directly inscribe a substrate which becomes the stamper 9 by selectively applying 12 a laser beam to a substrate to form a physical imprint of the data in analogue form on the surface of the substrate to create an analogue audio storage medium with an indirect structure.

In a preferred exemplary implementation of the invention as illustrated in FIG. 3a, digital audio data 13 is converted into topographical data representing an analogue translation of the digital audio data. This is achieved by importing the two-channel digital audio data into CAD software. In a CAD program the audio waveform of each channel is represented as a curve 14 (Bézier curve or polynomial (spline)) or polyline 15 that interpolates the digital audio data at distinct time steps by sampling the audio signal.

The sampling of the analogue audio is done at discrete time increments, marked by dots 15 in FIG. 3a. The analogue audio is sampled with a defined rate, for example above 44.1 kS/s, which means more than 44.100 samples per second, which corresponds to Audio CD quality. The higher the sampling rate the closer is the discrete sampled signal to the analogue signal. The samples are stored at a bit depth of 8, 16, 24 or 32 bit. The sampling is basically limited by available computer memory. The sampled signal is characterized by t0, dt, and Y(t), where t0 is a starting or offset time, dt>0 is the sampling interval (=1/sampling frequency) and Y(t) is the waveform amplitude at time t. Y(t0+i*dt) represents the sampled analogue audio at the time t0+i*dt, where i is an index value >=0.

Figure 3C:
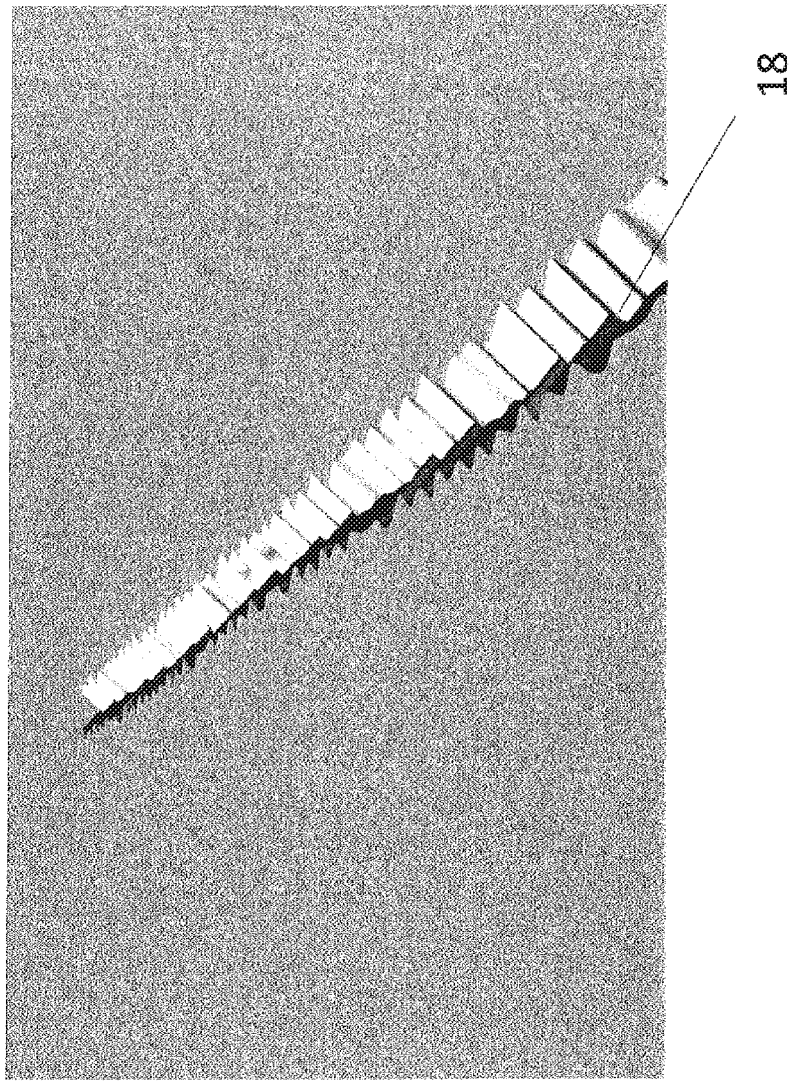
Figure 3D:
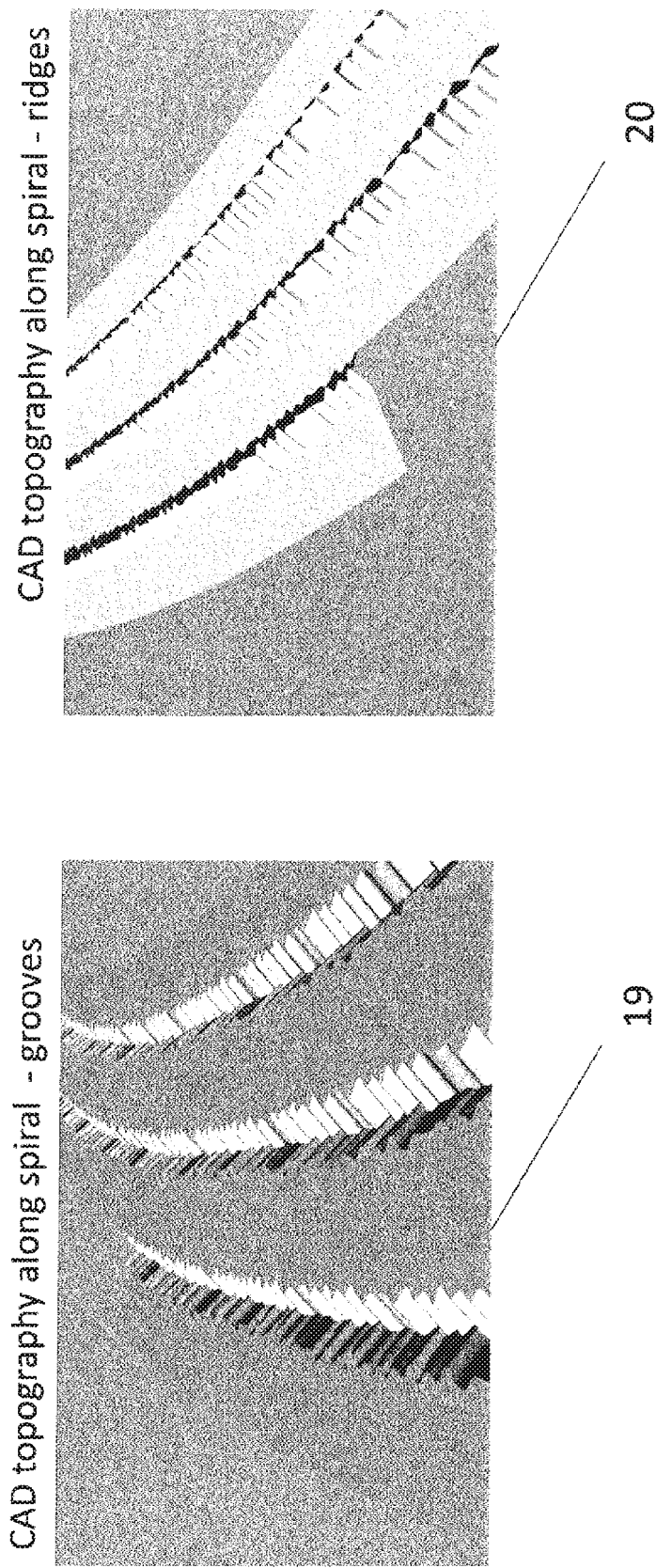

FIG. 3b shows the curve representation of the CAD imported audio data as two-channel i.e. stereo data comprising two curves 16 and 17 which represent a left and a right channel. By applying emulation software, the time steps are subsequently converted to 3D locations (xyz) according to the desired playback rotation speed of the analogue audio storage medium and the local radius of the groove. The curves are extruded to surfaces and tilted 45 degrees in order to form a V-shaped groove 18 and trimmed to standard groove dimensions (microgroove) as three-dimensionally illustrated in FIG. 3c. The obtained line-shaped groove is then manipulated by the software and bent into a spiral whilst the groove distance between neighbouring grooves is minimised according to the local waveform amplitude. A complex surface topography representing the transformed audio data is obtained as shown in FIG. 3d. This spiral topography may be either represented as grooves 19 which may be directly playable by a conventional playback device when inscribed on a substrate, or in the form of ridges 20 which may also be inscribed on the substrate. In the case of the latter, the medium resulting from the substrate would form a stamper. In a preferred implementation of the invention, both sides of the surface of a single substrate are used for the laser inscribing process. That is, one side (with grooves in the negative vertical direction) is used for the fabrication of a direct structure i.e. playable media, whilst the other side or flipped surface (with ridges representing the grooves in a positive vertical direction) is used for the fabrication of an indirect structure (stamper).

FIG. 3e depicts a V-shaped cross section of a modulated groove 30. The basic groove shape of an LP record can be mathematically described by an Archimedean or arithmetic spiral according to $r(phi)=GP/(2*\pi)*phi$; where GP is a positive parameter that denotes the groove pitch in one turn, phi denotes the rotation angle in radians and parameterizes the spiral. The Archimedean or arithmetic spiral has a constant separation between neighbouring turns. The Archimedean or arithmetic spiral describes the location of the central or bottom point 31 of a V-shaped conventional unmodulated groove. In order to calculate the modulated shape of the groove, the next step after calculating the basic groove is the mapping of each sampling interval dt to an angular increment dphi of the spiral and hence to a new position r on the spiral. At each new point the sampled amplitudes of the audio signal are superimposed to the unmodulated groove central (bottom) point 31. The left and right audio channel amplitude 32, 33 is added as a displacement vector 34 according to predefined flank angles 35 of the groove. This way, a modulated central or bottom shape of the groove 36 is obtained. The side walls (or edges, wings or flanks) defined by connecting lines between the central point 36 and the flank end points 37, 38 of the V-shaped groove are simply calculated by projecting the bottom groove points along the direction defined by the flank angles to a plane 39 defining the surface position, e.g. a plane 39 at z=0 if the vector shift of the bottom groove line is either in the positive or negative half space. Such, one obtains three points 36, 37, 38 in space that describe the V-shaped cross section of the groove 30 in cylindrical coordinates. Repeating this for the whole spiral, respectively the whole sampled signal, a point representation of the complete groove is obtained as a CAD object. In a subsequent step, neighbouring points can be joint to form facets which can be subsequently exported to a CAD compatible file format, e.g. STL or similar. The point-like CAD groove representation consisting of bottom and flank points 36, 37, 38 can be exported to other CAD formats such as DXF, IGS, STP etc. and further processed regarding machine control or CNC parameters and code for machining purposes.

The physical imprint of the topographical data onto materials may be done by either of the two ways. The first technique involves removal of material, e.g. ablation or cold ablation, from a solid target, e.g. steel, hard metals such as wolfram carbide, glass, sapphire, ceramics, polymers, organic-inorganic hybrid materials etc. The second technique is photopolymerization (lithographic exposure, two photon absorption based polymerization) of an organic material, e.g. polymer formulation, organic-inorganic hybrid resin or resist, that cures the materials locally. Polymers can be crosslinked lithographically with the laser. Two photon absorption based photopolymerization is a well-known process being capable of generating true 3D structures at highest resolutions and with very smooth surfaces inside the volume of a photosensitive material. Applying short pulsed (ps, fs) high power lasers, virtually any material can be ablated by focused laser pulses. Additionally the short interaction time between laser and target prevents a large heat affected zone of the material and hence melting or a liquid phase. Therefore precise micro-structures can be fabricated by such lasers. However, appropriate laser parameters need to be identified prior to manufacturing.

Applying such lasers to different materials, a topography of the CAD data is obtained. In order to obtain the contours for the relative laser focus to target movements the calculated CAD shape is subtracted from a volume shape representing the unprocessed target sample material. The resulting volume is sliced and hatched according to the focus spot size of the laser in order to yield a smooth line like (contour lines filling the volume) representation of the material to be removed. The most suitable parameters are material dependent and need to be experimentally defined prior to fabrication for each class of material. Starting point for the laser fluence is e.g. $F=c^2*Fth$, where F is the applied laser fluence and Fth denotes the threshold fluence for laser ablation of the respective material. The resulting roughness is minimized by evaluating optimal laser fluence, and spatial pulse-to-pulse separation on the target by measuring the surface roughness of each material. This is typically done during calibrating the machining process to a specific material. The physical structure is typically fabricated in a single overscan or multiple overscans. Multiple overscans at a lower laser fluence typically remove a smaller amount of material (a few nm up to a few hundreds of nanometers per overscan) during one scan and hence yield eventually a smoother surface finish as compared to laser pulses at a significantly higher fluence (or power), which usually lead to deep craters in the micron range and hence a rather rough surface being not suitable for the targeted application.

Figure 4:
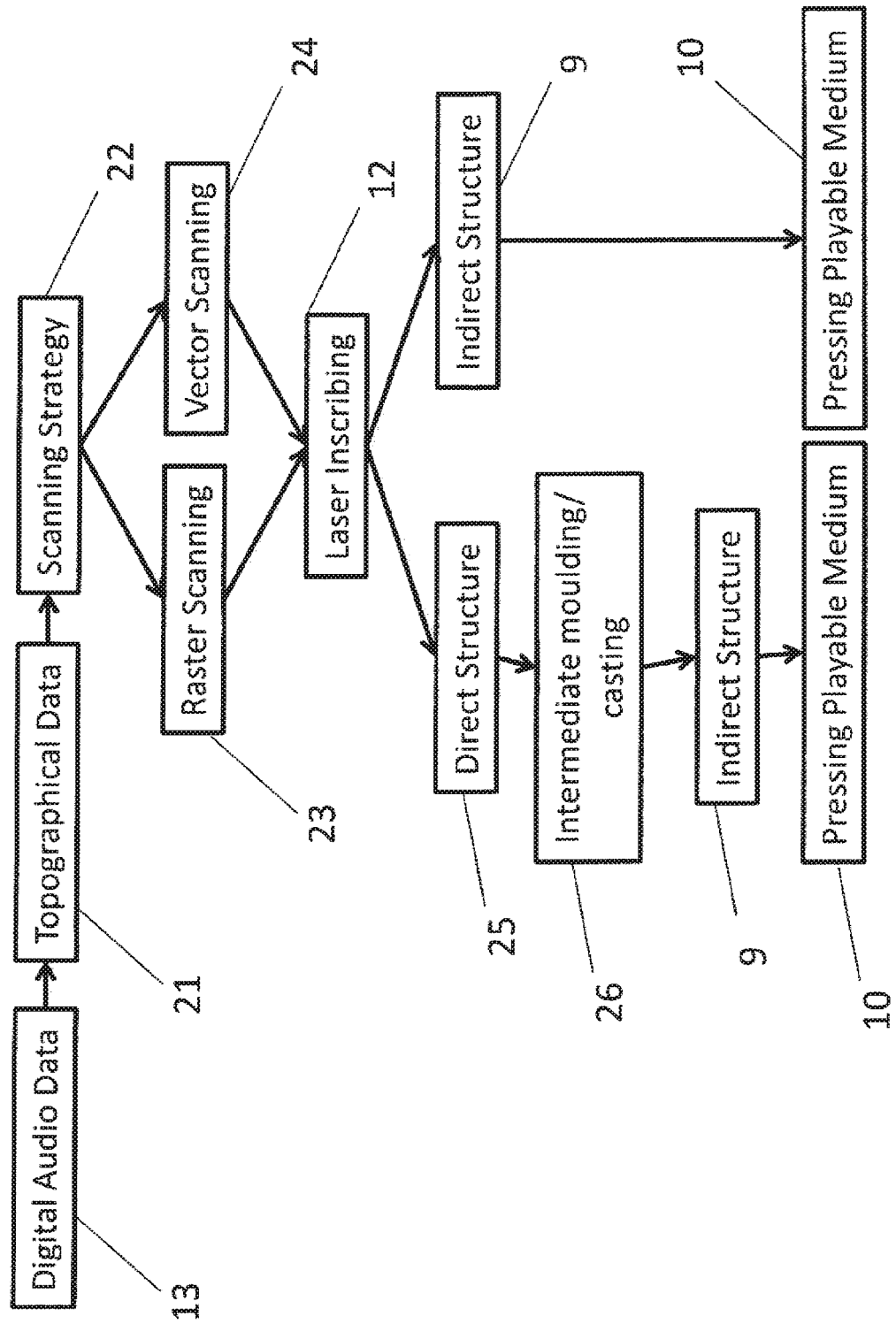
FIG. 4 shows a flowchart of preferred embodiments of the present invention.

FIG. 4 shows the possible methods of forming a final playable record 10 according to preferred implementations of the invention. As described above, the digital audio data 13 is converted into topographical data 21 which is then used in the laser inscribing process 12. At reference 22 a laser scanning strategy to write the topographical data 21 on the substrate 1 is chosen. According to two preferred exemplary implementations of the present invention, the laser inscribing process 12 may be performed by either raster scanning 23 or vector scanning 24. In one example, either of these methods of laser scanning are performed in order to inscribe a negative stamper 9 from which playable records 10 may be manufactured. In another example, either of the aforementioned methods of laser scanning are applied to inscribe the substrate 1 and produce a direct (playable) master structure 25 from which an intermediate moulding or casting 26 may be formed. The intermediate structure 26 may, in turn, be used to form an indirect structure 9 from which playable records 10 may be manufactured.

In a preferred implementation, the physical imprint is performed by raster scanning. FIGS. 5a and 5b respectively show an example of laser raster scanning 23 with a single laser beam 27 and an example of the physical imprint 2 of the audio data made in the substrate 1. In this case, the physical imprint 2 comprises a 3D inverse topology. As shown in FIG. 5a, the laser scanner meanders in horizontal i.e. in the x-y direction lines over the substrate. During this process the laser power is modulated according to the translated analogue audio data. In FIG. 5b, a detailed view of the recorded medium negative master stamper with the contour lines of the laser focus is shown. The height information of the profile is translated into a laser power profile so that the relevant surface topography is generated. The skilled person will appreciate that a number of different methods for raster laser scanning are possible. Examples of preferred implementations of raster scanning techniques in accordance with the present invention comprise at least one of the following:

1. The laser is fixed and the medium is moved linearly in an x, y and z-directions;
2. The laser is scanned in a one direction, for example with a polygon scanner, and the medium is moved in a perpendicular direction thereto;
3. The laser is scanned in an x-y direction and the medium is moved in the z-direction only; and
4. The laser is scanned in an x-y direction and the laser focus is moved in the z direction.

For all scanner methods, if the scan area is smaller than the area to be written then the entire surface to be written has to be composed from smaller sub-areas. This process is known as stitching.

FIG. 6 shows a diagram of laser vector scanning 24 according to an exemplary preferred implementation of the present invention. The laser beam 27 is scanned over the substrate 1 in a rotational motion which forms the physical imprint 2 of analogue data on the substrate 1 in an ever decreasing spiral. The skilled person will appreciate that this may be achieved by rotating the laser beam 27, rotating the substrate 1, or rotating both. It will also be appreciated that the rotational motion implemented to form the physical imprint 2 of analogue data on the substrate 1 may describe an ever increasing spiral rather than an ever decreasing spiral i.e. the analogue data being effectively written backwards.

FIG. 7 shows an example of laser vector scanning 24 with a rotating target (substrate 1) or rotating laser head. According to this example, two parallel laser beams 27a and 27b are split from a laser beam 27 generated by a laser emitter and input into a beam splitter 28. The two beams 27a and 27b are selectively applied to the substrate 1 to form a physical imprint 2 corresponding to an inverse topology according to a preferred implementation of the present invention. In this example, the laser beam 27a forms the left flank of the inverse topology (ridges) and the laser beam 27b forms the right flank of the inverse topology (ridges). The oscillation and intensity modulation of each individual laser beam 27a and 27b is adjustable for the relevant flank.

Figure 8:
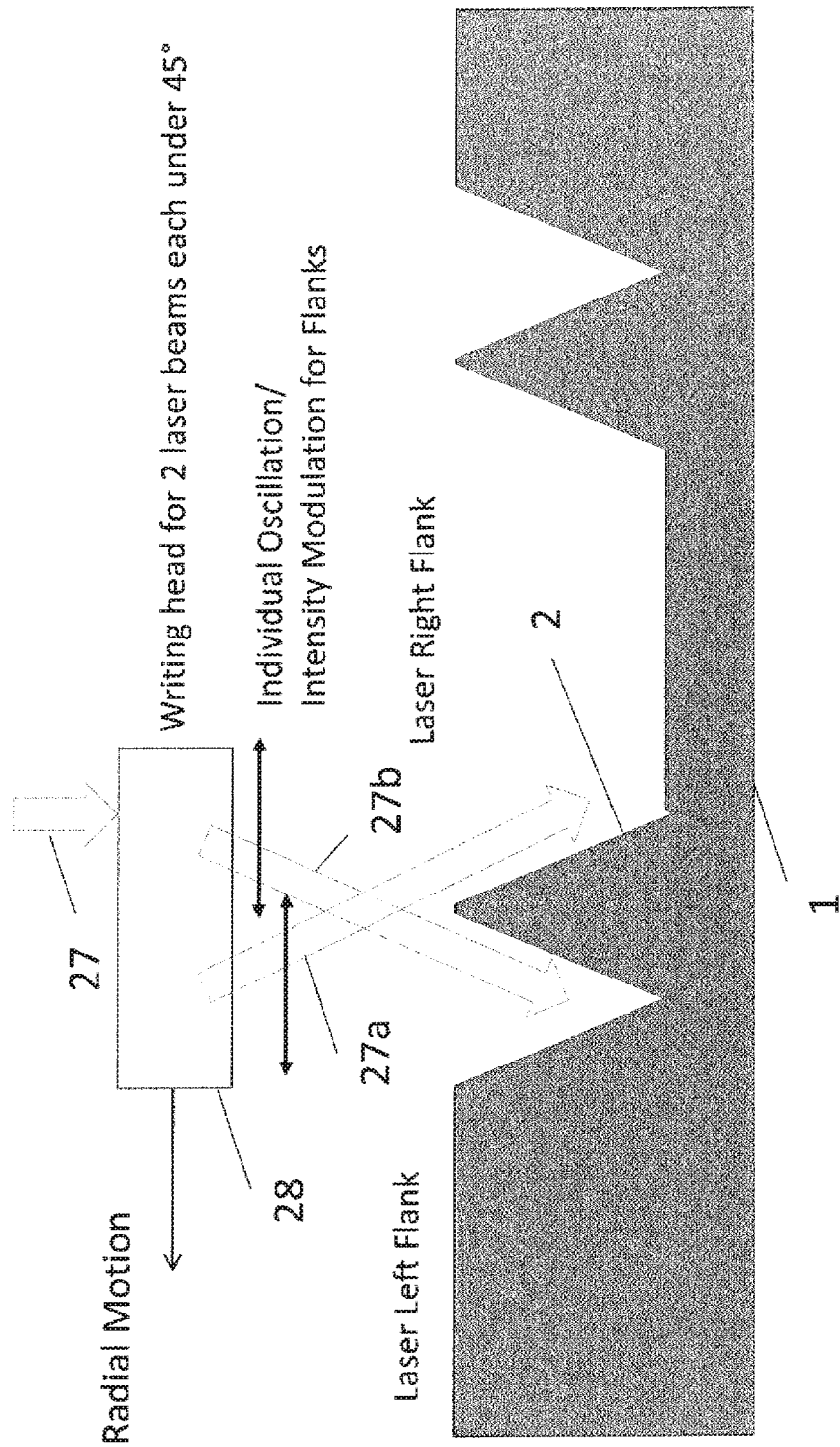
FIG. 8 shows an example of laser vector scanning with a rotating target or laser head and two diagonal crossing beams to form an inverse topology according to a preferred embodiment of the present invention.

FIG. 8 shows an example of laser vector scanning with a rotating target (substrate 1) or laser head. Similar to the example of FIG. 8, two laser beams 27a and 27b are split from a laser beam 27 generated by a laser emitter and input into a beam splitter. In this example, the two laser beams are not parallel to one another, but diagonally cross i.e. the opposite beams to those of FIG. 8 form the left and right flanks of the inverse topology (ridges) respectively. As with the example of FIG. 8 the oscillation and intensity modulation of each individual laser beam 27a and 27b is adjustable for the relevant flank.

FIG. 9 shows a flow diagram of preferred exemplary implementations of the present invention including both the software and hardware-based aspects thereof. The digital audio data 13 is converted into a CAD topography 21a to form a 3D surface model. The CAD topography 21a is then subject to a CAD mastering process 21b wherein CAD transformations such as scaling, trimming, inverting for volume and equalization are applied to the topographical data. The mastered data is then processed by software emulating 21c a record player. Quality controls are applied and modelling of the mechanical motion of a playback reading stylus and the left and right pickups. The software generated, mastered and processed data is then physically imprinted on a substrate by a laser writing process 12. The substrate may be comprise hard, transparent or non-transparent materials such as plastic, glass, sapphire glass, steel or any noble metals. The laser writing process 12 may generate an inverse topographical imprint of the audio data wherein a negative stamper 9 is manufactured from the substrate, which can then be used to press mould vinyl records 10. The laser inscribing process 12 may also generate a direct structure 25 with a direct topographical imprint of the analogue audio data in the substrate 1. In this case, the substrate 1 is formed into a directly playable medium which may further be formed in one or more special formats and or formed from one or more special materials.

The invention claimed is:

1. A computer-implemented method of manufacturing an analogue audio storage medium, the method comprising:
    converting digital audio data into topographical data representing an analogue translation of the digital audio data, wherein the converting includes:
        importing the digital audio data into computer-aided design software (CAD software) and transforming the digital audio data into a continuous analogue signal by interpolation using the CAD software; and
        sampling the continuous analogue signal to determine discrete values of amplitude as a function of time to create the topographical data;
    selectively applying a laser beam to a substrate to form a physical imprint of the topographical data on the surface of the substrate to create an analogue audio storage medium.

2. The method of claim 1 further comprising processing the topographical data with an emulator of an analogue playback device.

3. The method of claim 1, wherein the analogue audio storage medium is a record.

4. The method of claim 1 further comprising mastering the topographical data to modulate the sound quality.

5. The method of claim 1, wherein the forming of the physical imprint is performed by raster scanning.

6. The method of claim 1, wherein the forming of the physical imprint is performed by vector scanning.

7. The method of claim 1, wherein the laser beam is emitted from at least one short pulse laser.

8. The method of claim 1, wherein the physical imprint directly corresponds to the topographical data and the analogue audio storage medium can be directly played by an analogue playback device.

9. The method of claim 1, wherein the physical imprint comprises an inverse topography of the topographical data and the analogue audio storage medium formed is a negative master.

10. The method of claim 1, wherein the substrate comprises at least one of hard metals, glass, sapphire glass, a resin, and a resist consisting of a photosensitive organic polymer or organic-inorganic hybrid polymer formulation or blend.

11. The method of claim 10, wherein the hard metals include one or more of tungsten carbide, stainless steel, and tool steel.

12. The method of claim 1, further comprising applying a coating layer to the analogue audio storage medium.

13. A computer-implemented, non-transitory storage medium with instructions, wherein, when the instructions are executed by a processor, cause the following method steps to be performed:
    converting digital audio data into topographical data representing an analogue translation of the digital audio data, wherein the converting includes:
        importing the digital audio data into computer-aided design software (CAD software) and transforming the digital audio data into a continuous analogue signal by interpolation using the CAD software; and sampling the continuous analogue signal to determine discrete values of amplitude as a function of time to create the topographical data;

wherein the topographical data is suitable for selectively applying a laser beam to a substrate to form a physical imprint of the topographical data on the surface of the substrate to create an analogue audio storage medium.

14. A computer-implemented method of manufacturing an analogue audio storage medium, the method comprising:

converting digital audio data into topographical data representing an analogue translation of the digital audio data, wherein the converting includes:

transforming the digital audio data into a continuous analogue signal by interpolation; and sampling the continuous analogue signal to determine discrete values of amplitude as a function of time to create the topographical data;

selectively applying a laser beam to a substrate to form a physical imprint of the topographical data on the surface of the substrate to create an analogue audio storage medium.

15. The method of claim 14, further comprising:

importing the digital audio data into computer-aided design software (CAD software); and transforming the digital audio data into the continuous analogue signal using the CAD software.

16. The method of claim 14, wherein the sampling comprises sampling the continuous analogue signal at discrete time intervals, the method further comprising:

providing a substrate comprising a V-shaped unmodulated groove or ridge, wherein the location of the central point of the groove or ridge describes a spiral; and mapping each sampling interval to respective positions on the spiral and superimposing the sampled amplitudes to respective central points of the unmodulated groove or ridge.

17. The method of claim 16, wherein selectively applying the laser beam comprises scanning the laser beam over the substrate while modulating the laser power according to the topographical data to form the physical imprint of the topography on the surface of the substrate to create the analogue audio storage medium.

18. A computer-implemented, non-transitory storage medium with instructions, wherein, when the instructions are executed by a processor, cause the following method steps to be performed:

converting digital audio data into topographical data representing an analogue translation of the digital audio data, wherein the converting includes:

transforming the digital audio data into a continuous analogue signal by interpolation; and sampling the continuous analogue signal to determine discrete values of amplitude as a function of time to create the topographical data;

selectively applying a laser beam to a substrate to form a physical imprint of the topographical data on the surface of the substrate to create an analogue audio storage medium.

* * * * *